(12) United States Patent
Li

(10) Patent No.: US 9,762,190 B2
(45) Date of Patent: Sep. 12, 2017

(54) APPARATUS AND METHOD IN APPARATUS

(71) Applicant: Nokia Technologies Oy, Espoo (FI)

(72) Inventor: Lei Li, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/902,199

(22) PCT Filed: Jul. 4, 2013

(86) PCT No.: PCT/CN2013/078791
§ 371 (c)(1),
(2) Date: Dec. 30, 2015

(87) PCT Pub. No.: WO2015/000156
PCT Pub. Date: Jan. 8, 2015

(65) Prior Publication Data
US 2016/0204752 A1 Jul. 14, 2016

(51) Int. Cl.
*H03F 3/26* (2006.01)
*H03F 3/30* (2006.01)
(52) U.S. Cl.
CPC ............ *H03F 3/3001* (2013.01); *H03F 3/30* (2013.01); *H03F 3/3022* (2013.01);
(Continued)
(58) Field of Classification Search
CPC ... H03F 3/26; H03F 3/265; H03F 3/30; H03F 3/3001
(Continued)

(56) References Cited

U.S. PATENT DOCUMENTS 3,988,691 A * 10/1976 Shih ................. H03F 3/3066
330/265
4,739,281 A 4/1988 Doyle
(Continued)

FOREIGN PATENT DOCUMENTS

| CN | 1924981 A | 3/2007 |
| CN | 101247110 A | 8/2008 |
| JP | H08-139530 A | 5/1996 |

OTHER PUBLICATIONS

International Search Report and Written Opinion received for corresponding Patent Cooperation Treaty Application No. PCT/CN2013/078791, dated Mar. 27, 2014, 9 pages.
(Continued)

*Primary Examiner* — Steven J Mottola
(74) *Attorney, Agent, or Firm* — Mintz Levin Cohn Ferris Glovsky and Popeo, P.C.

(57) ABSTRACT

There are disclosed various methods and apparatuses. In some embodiments of the method an input signal is provided to an input of a first transistor of a push-pull circuit via a first slew-rate adjuster; and the input signal is also provided to an input of a second transistor of the push-pull circuit via a second slew-rate adjuster. The input signal is effected by the first slew-rate adjuster and the second slew-rate adjuster to switch the first transistor on after the second transistor switches off when the amplitude of the input signal increases. The input signal is effected by the first slew-rate adjuster and the second slew-rate adjuster the input signal to switch the second transistor on after the first transistor switches off when the amplitude of the input signal decreases. In some embodiments the apparatus comprises a push-pull circuit comprising a first transistor and a second transistor; an input to receive an input signal; a first slew-rate adjuster adapted to provide the input signal to the input of the first transistor; and a second slew-rate adjuster adapted
(Continued)

to provide the input signal to the input of the second transistor. A time constant of the first slew-rate adjuster is dependent on the direction of change of the input signal, and a time constant of the second slew-rate adjuster is dependent on the direction of change of the input signal.

13 Claims, 7 Drawing Sheets

(52) U.S. Cl.
CPC .. *H03F 2003/3003* (2013.01); *H03F 2200/03* (2013.01); *H03F 2200/451* (2013.01); *H03F 2203/30078* (2013.01); *H03F 2203/30081* (2013.01); *H03F 2203/30111* (2013.01); *H03F 2203/30114* (2013.01)

(58) Field of Classification Search
USPC ................................. 330/263, 264, 267, 268
See application file for complete search history.

(56) References Cited

U.S. PATENT DOCUMENTS

| | | |
|---|---|---|
| 6,154,069 A | 11/2000 | Ebihara |
| 7,449,913 B1 | 11/2008 | Hung |
| 2003/0062937 A1 | 4/2003 | Lee |

OTHER PUBLICATIONS

"Push-pull output", Wikipedia, Retrieved on Dec. 8, 2016, Webpage available at : https://en.wikipedia.org/wiki/Push%E2%80%93pull_output.

Hall et al., "Advanced Signal Integrity for High-Speed Digital Designs", Wiley Publication, Feb. 2009, 668 pages.

Extended European Search Report received for corresponding European Patent Application No. 13888804.5, dated Dec. 9, 2016, 9 pages.

Dally, et al., "Digital Systems Engineering," Cambridge University Press, Jun. 28, 1998, 690 pages.

* cited by examiner

APPARATUS AND METHOD IN APPARATUS

RELATED APPLICATION

This application was originally filed as Patent Cooperation Treaty Application No. PCT/CN2013/078791 filed Jul. 4, 2013.

TECHNICAL FIELD

The present invention relates to a method in an apparatus comprising a first transistor and a second transistor arranged in a push-pull configuration and apparatus comprising a first transistor and a second transistor arranged in a push-pull configuration.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

In some apparatuses which are able to transmit signals by a transmitter may utilize an amplifier which amplifies the signal to be transmitted before the signal is fed to an antenna. Such amplifiers may utilize a so-called push-pull configuration (circuit) in which two transistors are connected together in a certain manner. The transistors are semiconductor elements which may have e.g. an input and two outputs. With bibolar transistors the input may be called as a base and the output ports are called an emitter and a collector. With field effect transistors (FET) such as MOS-FETs (metal-oxide on silicon field effect transistor) the input may be called as a gate and the outputs may be called as a source and a drain. In the push-pull circuit one of the transistors is of a pnp-type (or p-type) and the other transistor is of an npn-type (or n-type). Ideally, one of the transistors pushes current to a load when the input is above a certain voltage level and the other transistor pulls current from the load when the input is below the voltage level. However, in practical implementations it may occur that when the input is near the voltage level both transistors may be active i.e. one transistor pushes current to the source and the other transistor simultaneously pulls current from the load. This causes a current spike at the output of the push-pull circuit which may disturb the amplified signal and increase power consumption. This current may also be called as leaking current because it does not go to the load but leaks from one transistor to the other. The push-pull circuit is also used in many other circuits than amplifiers. It may be used e.g. in digital integrated circuits for example as output ports or in internal logic circuits or as semiconductor switches.

SUMMARY

Various embodiments provide a method and apparatus for reducing leakage current in a push-pull circuit. In some embodiments an input signal to an input of a first transistor of a push-pull circuit is provided via a first slew-rate adjuster and the input signal to an input of a second transistor of the push-pull circuit is provided via a second slew-rate adjuster. The time constant of the first slew-rate adjuster and the second slew-rate adjuster depends on the direction of a change of the input signal. In other words, when the input signal increases (i.e. the amplitude of the input signal becomes more positive) the voltage at the input of the transistor changes at different speeds depending on the direction of change of the input signal.

Various aspects of examples of the invention are provided in the detailed description.

According to a first aspect, there is provided a method comprising:

providing an input signal to an input of a first transistor of a push-pull circuit via a first slew-rate adjuster;

providing the input signal to an input of a second transistor of the push-pull circuit via a second slew-rate adjuster;

effecting by the first slew-rate adjuster and the second slew-rate adjuster the input signal to switch the first transistor on after the second transistor switches off when the amplitude of the input signal increases; and effecting by the first slew-rate adjuster and the second slew-rate adjuster the input signal to switch the second transistor on after the first transistor switches off when the amplitude of the input signal decreases.

According to a second aspect, there is provided an apparatus comprising:

a push-pull circuit comprising a first transistor and a second transistor;

an input to receive an input signal;

a first slew-rate adjuster adapted to provide the input signal to the input of the first transistor;

a second slew-rate adjuster adapted to provide the input signal to the input of the second transistor;

wherein a time constant of the first slew-rate adjuster is dependent on the direction of change of the input signal, and a time constant of the second slew-rate adjuster is dependent on the direction of change of the input signal.

According to a third aspect, there is provided an apparatus comprising:

means for receiving an input signal;

means for providing the input signal to the input of the first transistor of a push-pull circuit as a low-passed filtered signal;

means for providing the input signal to the input of the second transistor of the push-pull circuit as a low-passed filtered signal;

means for providing the input signal to the input of the first transistor comprising means for arranging a time constant of the slew-rate adjuster dependent on the direction of change of the input signal; and means for providing the input signal to the input of the second transistor comprising means for arranging a time constant of the slew-rate adjuster dependent on the direction of change of the input signal.

In some embodiments the first transistor and the second transistor are mosfet transistors, wherein the input of the transistor is a gate of the mosfet transistor.

In some embodiments the first slew-rate adjuster comprises a first resistor, a first diode and a first capacitor and the second slew-rate adjuster comprises a second resistor, a second diode and a second capacitor.

In some embodiments the resistor and the diode are connected in parallel.

In some embodiments the diodes are Schottky diodes.

In some embodiments the capacitor is connected between the gate and an output of the transistor.

In some embodiments a parasitic capacitance of the transistor is used as the capacitor of the slew-rate adjuster.

The anti-symmetric slew-rate adjustment may reduce or even eliminate the leakage current through the push-pull circuit because both transistors are not in an active state simultaneously.

BRIEF DESCRIPTION OF THE DRAWINGS

For a more complete understanding of example embodiments of the present invention, reference is now made to the following descriptions taken in connection with the accompanying drawings in which:

FIG. 4b shows an example of a timing diagram of the operation of the apparatus of FIG. 4a;

FIG. 5b shows an example of a timing diagram of the operation of the apparatus of FIG. 5a;

FIG. 5c shows another example of a timing diagram of the operation of the apparatus of FIG. 5a;

DETAILED DESCRIPTION OF SOME EXAMPLE EMBODIMENTS

The following embodiments are exemplary. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments.

Figure 2:
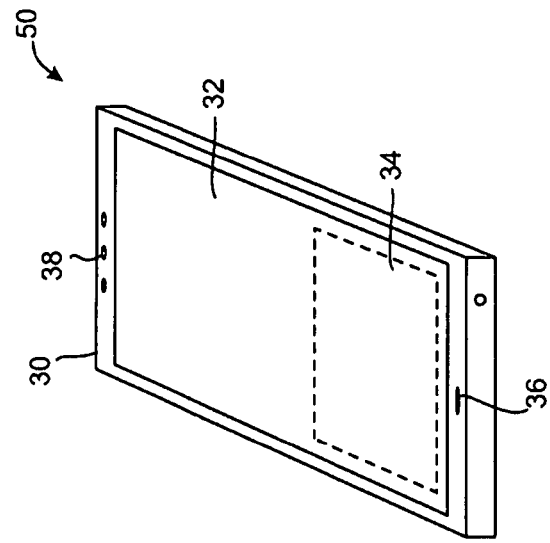
FIG. 2 shows an apparatus according to an example embodiment.
Figure 1:
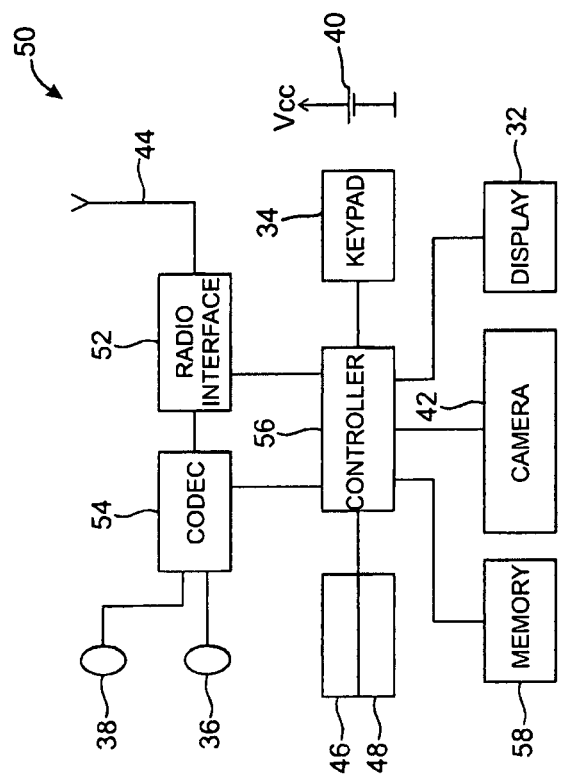
FIG. 1 shows a block diagram of an apparatus according to an example embodiment.

The following describes in further detail suitable apparatus and possible mechanisms for implementing the embodiments of the invention. In this regard reference is first made to FIG. 1 which shows a schematic block diagram of an exemplary apparatus or electronic device 50 depicted in FIG. 2, which may incorporate a receiver front end according to an embodiment of the invention.

The electronic device 50 may for example be a mobile terminal or user equipment of a wireless communication system. However, it would be appreciated that embodiments of the invention may be implemented within any electronic device or apparatus which may require reception of radio frequency signals.

The apparatus 50 may comprise a housing 30 for incorporating and protecting the device. The apparatus 50 further may comprise a display 32 in the form of a liquid crystal display. In other embodiments of the invention the display may be any suitable display technology suitable to display an image or video. The apparatus 50 may further comprise a keypad 34. In other embodiments of the invention any suitable data or user interface mechanism may be employed. For example the user interface may be implemented as a virtual keyboard or data entry system as part of a touch-sensitive display. The apparatus may comprise a microphone 36 or any suitable audio input which may be a digital or analogue signal input. The apparatus 50 may further comprise an audio output device which in embodiments of the invention may be any one of: an earpiece 38, speaker, or an analogue audio or digital audio output connection. The apparatus 50 may also comprise a battery 40 (or in other embodiments of the invention the device may be powered by any suitable mobile energy device such as solar cell, fuel cell or clockwork generator). The apparatus may further comprise an infrared port 42 for short range line of sight communication to other devices. In other embodiments the apparatus 50 may further comprise any suitable short range communication solution such as for example a Bluetooth wireless connection or a USB/firewire wired connection.

The apparatus 50 may comprise a controller 56 or processor for controlling the apparatus 50. The controller 56 may be connected to memory 58 which in embodiments of the invention may store both data and/or may also store instructions for implementation on the controller 56. The controller 56 may further be connected to codec circuitry 54 suitable for carrying out coding and decoding of audio and/or video data or assisting in coding and decoding carried out by the controller 56.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system or a wireless local area network. The apparatus 50 may further comprise an antenna 102 connected to the radio interface circuitry 52 for transmitting radio frequency signals generated at the radio interface circuitry 52 to other apparatus(es) and for receiving radio frequency signals from other apparatus(es).

In some embodiments of the invention, the apparatus 50 comprises a camera capable of recording or detecting imaging.

Figure 3:
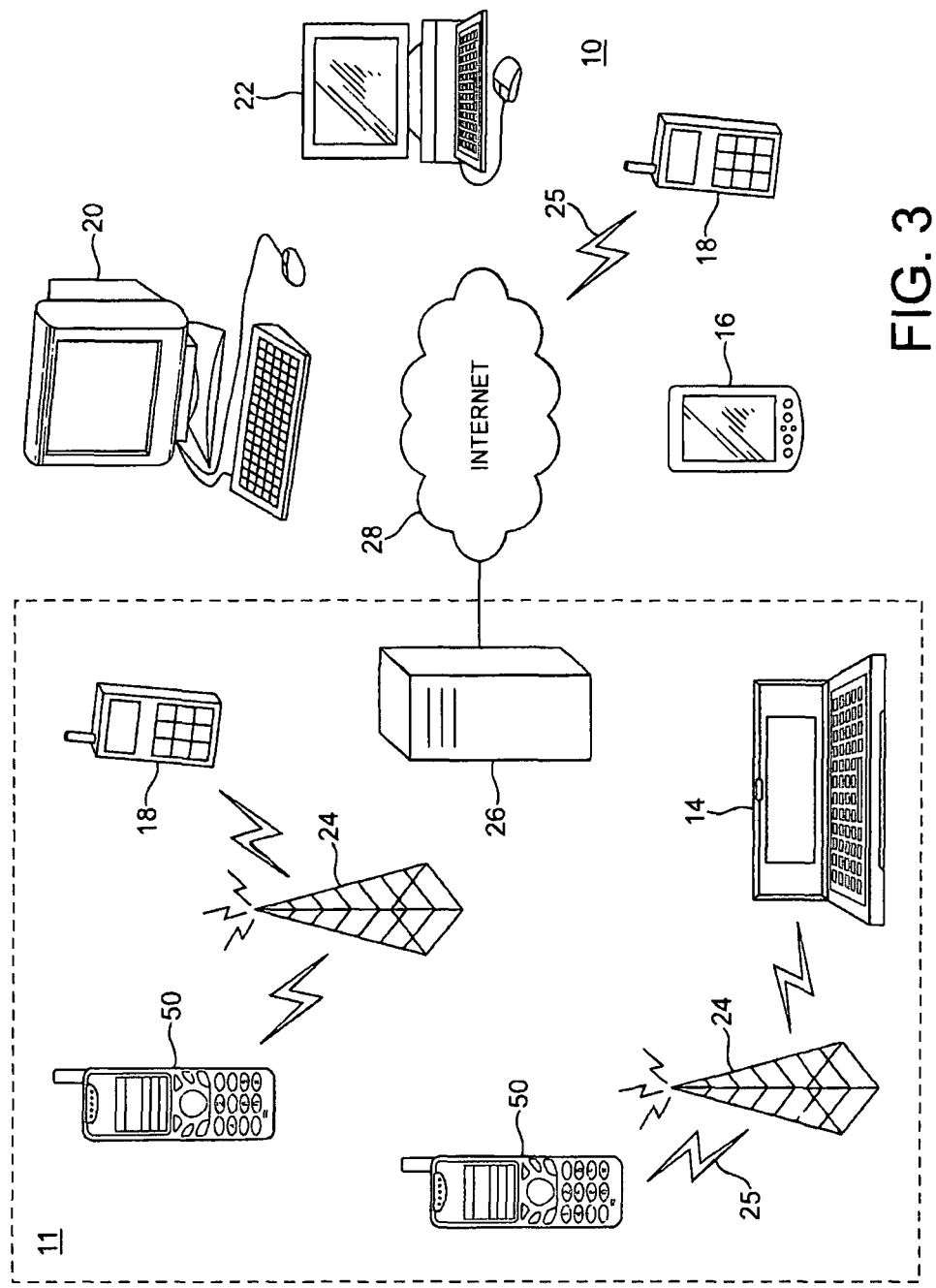
FIG. 3 shows an example of an arrangement for wireless communication comprising a plurality of apparatuses, networks and network elements.

With respect to FIG. 3, an example of a system within which embodiments of the present invention can be utilized is shown. The system 10 comprises multiple communication devices which can communicate through one or more networks. The system 10 may comprise any combination of wired and/or wireless networks including, but not limited to a wireless cellular telephone network (such as a GSM, UMTS, CDMA network etc.), a wireless local area network (WLAN) such as defined by any of the IEEE 802.x standards, a Bluetooth personal area network, an Ethernet local area network, a token ring local area network, a wide area network, and the Internet.

For example, the system shown in FIG. 3 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include, but are not limited to, an electronic device or apparatus 50, a combination of a personal digital assistant (PDA) and a mobile telephone 14, a PDA 16, an integrated messaging device (IMD) 18, a desktop computer 20, a notebook computer 22. The apparatus 50 may be stationary or mobile when carried by an individual who is moving. The apparatus 50 may also be located in a mode of transport including, but not limited to, a car, a truck, a taxi, a bus, a train, a boat, an airplane, a bicycle, a motorcycle or any similar suitable mode of transport.

Some or further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telecommunications system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11 and any similar wireless communication technology. A communications device involved in implementing various embodiments of the present invention may communicate using various media including, but not limited to, radio, infrared, laser, cable connections, and any suitable connection. In the following some example implementations of apparatuses utilizing the micromechanical resonator will be described in more detail.

Figure 4B:
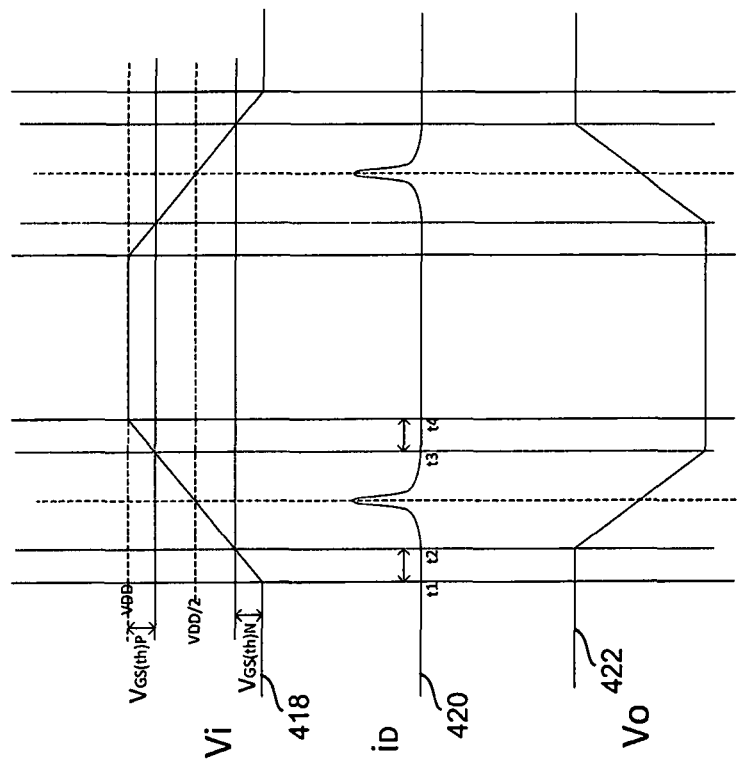
Figure 4A:
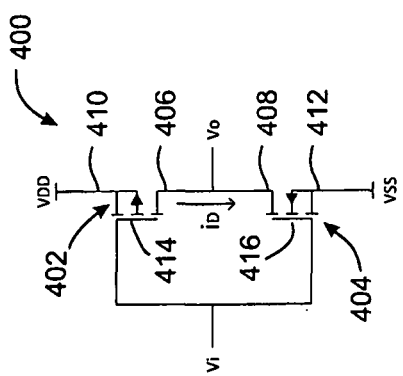
FIG. 4a shows a principle of a push-pull configuration.

FIG. 4a depicts an example of a push-pull circuit 400 and FIG. 4b shows an example of a timing diagram of the operation of the apparatus of FIG. 4a. The push-pull circuit 400 comprises a first transistor 402 and a second transistor 404. The transistors 402, 404 may be mosfet transistors, fet transistors or other kinds of transistors. The first transistor 402 may be an n-type MOSFET transistor or a pnp-type transistor wherein the second transistor 404 may be a p-type MOSFET transistor or an npn-type transistor, or vice versa i.e. the first transistor 402 may be a p-type MOSFET transistor or an npn-type transistor wherein the second transistor 404 may be an n-type MOSFET transistor or a pnp-type transistor. When using MOSFET or FET transistors the drain 406 of the first transistor and the drain 408 of the second transistor may be directly connected to each other, or there may be one or more components in between. The source 410 of the first transistor 402 is connected either directly or through a resistor or some other component(s) to a positive supply voltage, or to a ground level if the positive supply voltage is not used, and the source 412 of the second transistor 404 is connected either directly or through a resistor or some other component(s) to a negative supply voltage, or to a ground level if the negative supply voltage is not used. The gates 414, 416 of the transistors 402, 404 may also be connected together. The gates 414, 416 may be used to receive an input signal.

In FIG. 4b the curve 418 represents the input signal at gates 414, 416, the curve 420 represents the leakage current $i_D$ from the drain of the first transistor 402 to the drain of the second transistor 404, and the curve 422 represents the output signal Vo at the drains of the transistors. It can be seen that when the level of the input signal approaches a switching level, which is in this example about in the middle of the positive voltage supply $V_{DD}$ and the negative voltage supply $V_{SS}$, the leakage current increases and is at the highest level when the input signal is at the switching level. At this stage both transistors 402, 404 are in a conducting state (is switched on). If the level of the input signal continues to rise, the leakage current begins to decrease. At some point the first transistor switches off i.e. becomes in a non-conducting state and only the second transistor 404 is switched on. Similar behavior can be seen when the level of the input signal decreases. In this situation the first transistor 402 begins to conduct before the second transistor 404 has been switched off.

Figure 5B:
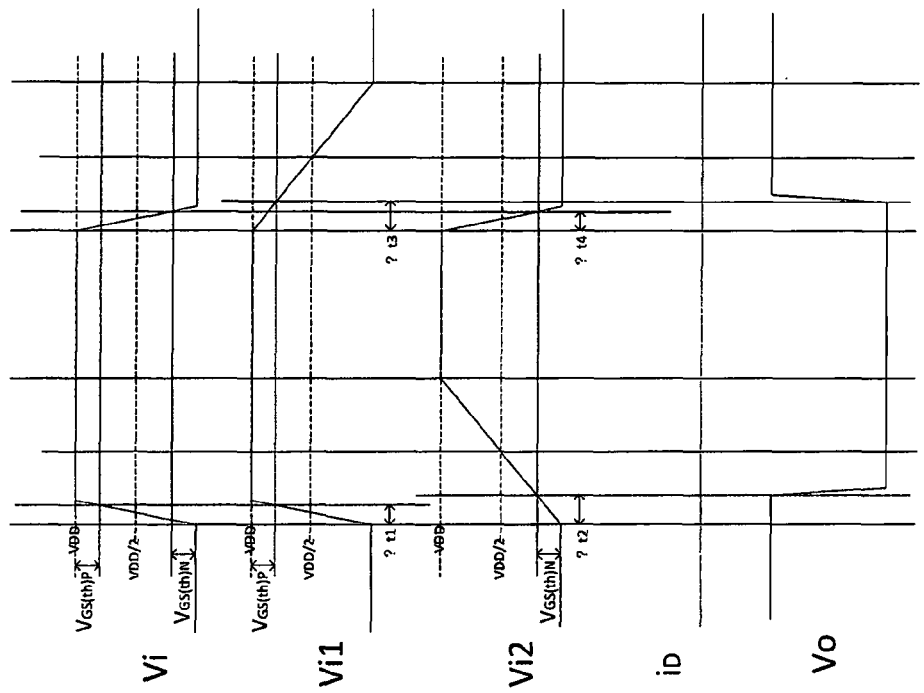
Figure 5A:
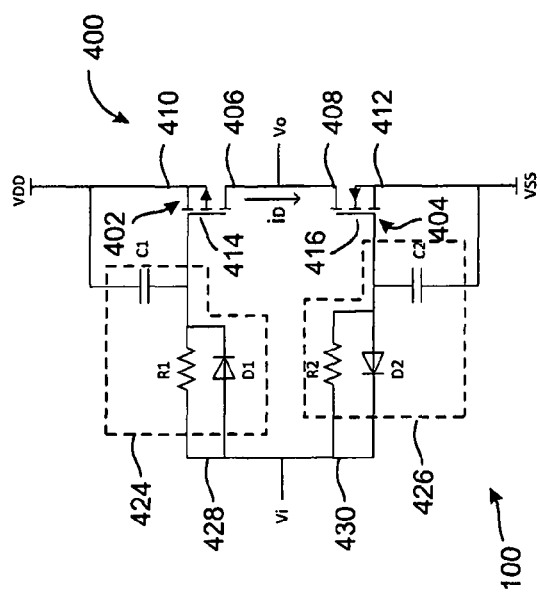
FIG. 5a shows a simplified block diagram of an apparatus according to an example embodiment.

FIG. 5a shows a simplified block diagram of an apparatus 100 according to an example embodiment. In this non-limiting example embodiment the apparatus 100 comprises a first transistor 402 and a second transistor 404 arranged in a push-pull configuration. The transistors 402, 404 comprise at least one input (e.g. a gate or a base) and two outputs (e.g. a source and a drain, or an emitter and a collector). The input can be used to control the behaviour of the outputs. For example, the voltage level at the input may be used to control the current flowing through the transistor e.g. from the drain to the source.

The apparatus 100 also comprises a first slew-rate adjuster 424 and a second slew-rate adjuster 426. An output 428 of the first slew-rate adjuster 424 is connected to the input of the first transistor 402 and an output 430 of the second slew-rate adjuster 426 is connected to the input of the second transistor 404. An input 428 of the first slew-rate adjuster 424 is connected to an input of the second slew-rate adjuster 426. This mutual connection may thus be used to provide input signals 432 to the apparatus.

In some embodiments the first slew-rate adjuster 424 comprises a first resistor R1 and a first diode D1 connected in parallel. Correspondingly, the second slew-rate adjuster 426 may comprise a second resistor R2 and a second diode D2 connected in parallel. However, the first diode D1 is in a forward biased connection with respect to the input of the first transistor 402 and the second diode R2 is in a reverse biased connection with respect to the input of the second transistor 404 in this example embodiment. It should be noted, however, that in some other embodiments the first diode D1 may be in a reverse biased connection and the second diode R2 is in a forward biased connection. The reason for this kind of arrangement is explained later in this description.

Figure 6:
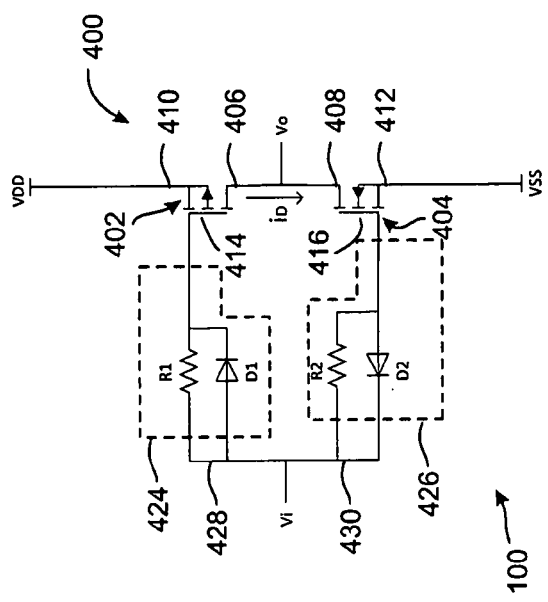
FIG. 6 shows a simplified block diagram of an apparatus according to another example embodiment.

In some embodiments the first slew-rate adjuster 424 also comprises a first capacitor C1 connected between the input of the first transistor 402 and the source of the first transistor 402. Correspondingly, the second slew-rate adjuster 426 may also comprise a second capacitor C2 connected between the input of the second transistor 404 and the source of the second transistor 404. In some other embodiments the parasitic capacitance of the transistors 402, 404 may be sufficient to provide appropriate time constants for the slew-rate adjusters 424, 426. An example of this kind of apparatus is depicted in FIG. 6.

Figure 9:
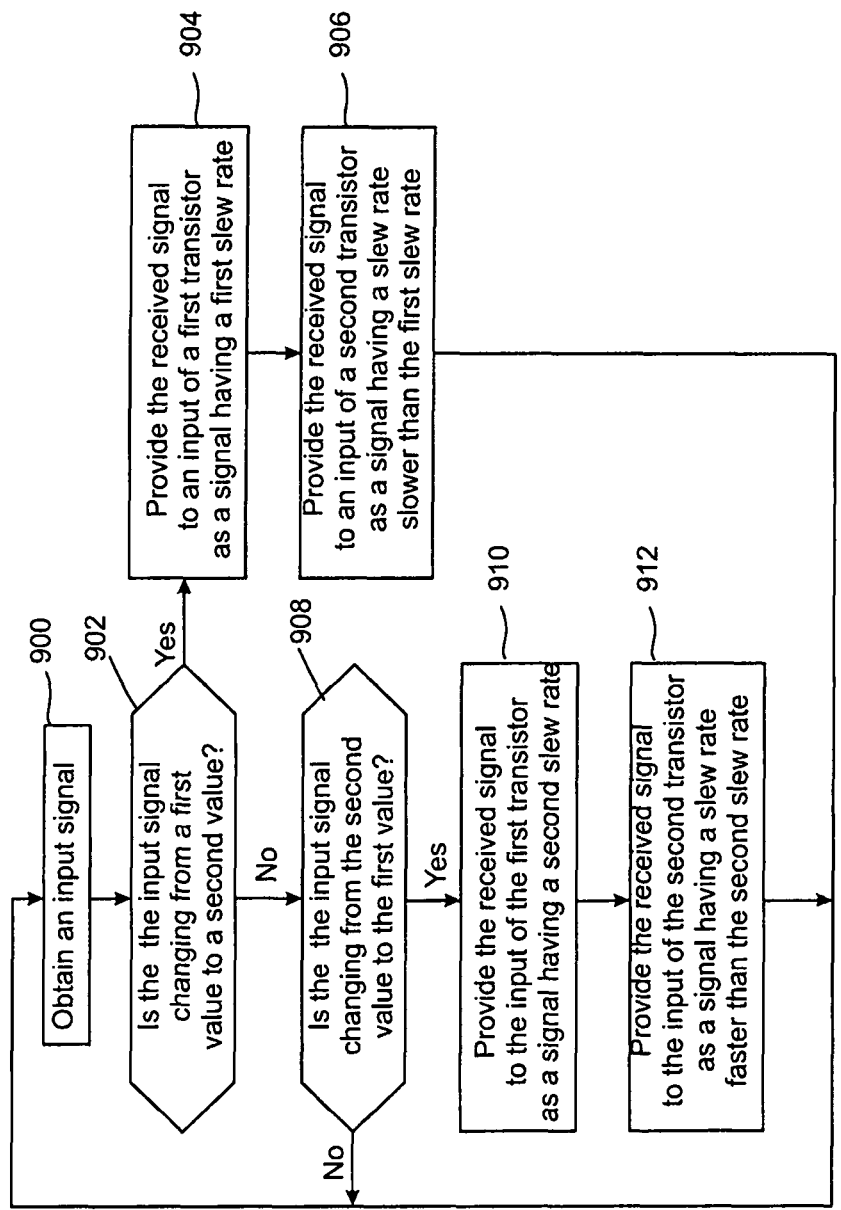
FIG. 9 depicts a method according to an embodiment.

In the following, the operation of the apparatus 100 is explained with reference to the timing diagram depicted in FIG. 5b and the flow diagram of FIG. 9. In this example it is assumed that the source of the first transistor 402 is connected to a positive supply voltage $V_{PP}$ and the source of the second transistor 404 is connected to a negative supply voltage $V_{SS}$. It is also assumed that the voltage level of the input signal (block 900 in FIG. 9) varies between negative peak values and positive peak values.

In FIG. 5b the input signal Vi is first at the negative peak value wherein the voltage level at the input of the first transistor 402 and at the input of the second transistor 404 is approximately the same than the level of the input signal Vi. Hence, the second transistor 404 is switched off (i.e. current does not flow through the second transistor 404 or only a small current flows through the second transistor 404) and the first transistor 402 is switched off (i.e. current flows through the first transistor 402). When the input signal begins to increase (block 902) from the negative peak value to the positive peak value the voltage levels at the inputs of the transistors 402, 404 do not directly follow the input signal but they ramp up more slowly. The first diode D1 is forward biased with respect to the input signal wherein when the level of the input signal increases the input of the first transistor 402 is charged via the first diode D1 (block 904). The second diode D2 is reverse biased with respect to the input signal wherein the input of the second transistor 404 is charged via the second resistor R2 (block 906). The capacitors C1, C2 may also affect the speed the voltage increases at the input of the transistors 402, 404. In some embodiments the capacitances of the capacitors C1, C2 are substantially the same. Also the resistances of the resistors R1, R2 may be substantially the same. Hence, the timing constant of the first slew-rate adjuster 424 is smaller than the timing constant of the second slew-rate adjuster 426 which means that the first transistor 402 switches off before the second transistor 404 switches on.

In a situation in which the input signal begins to decrease (block 908) from the positive peak value towards the negative peak value the voltage levels at the inputs of the transistors 402, 404 do not directly follow the input signal but they ramp down more slowly. The first diode D1 is now reverse biased with respect to the input signal wherein when the level of the input signal decreases the input of the first transistor 402 is charged via the first resistor R1 (block 910). The second diode D2 is now forward biased with respect to the input signal wherein the input of the second transistor 404 is charged via the second diode D2 (block 912). Also in this situation the capacitors C1, C2 may affect the speed the voltage decreases at the input of the transistors 402, 404. In this situation the timing constant of the first slew-rate adjuster 424 is greater than the timing constant of the second slew-rate adjuster 426 which means that the second transistor 404 switches off before the first transistor 402 switches on.

On the basis of above it can be concluded that the first transistor and the second transistor 404 are not simultaneously in a conducting state (i.e. switched on). Therefore, the leakage current may be quite small and may not contain any spikes at the moments when the transistors of the push-pull configuration change state.

Figure 5C:
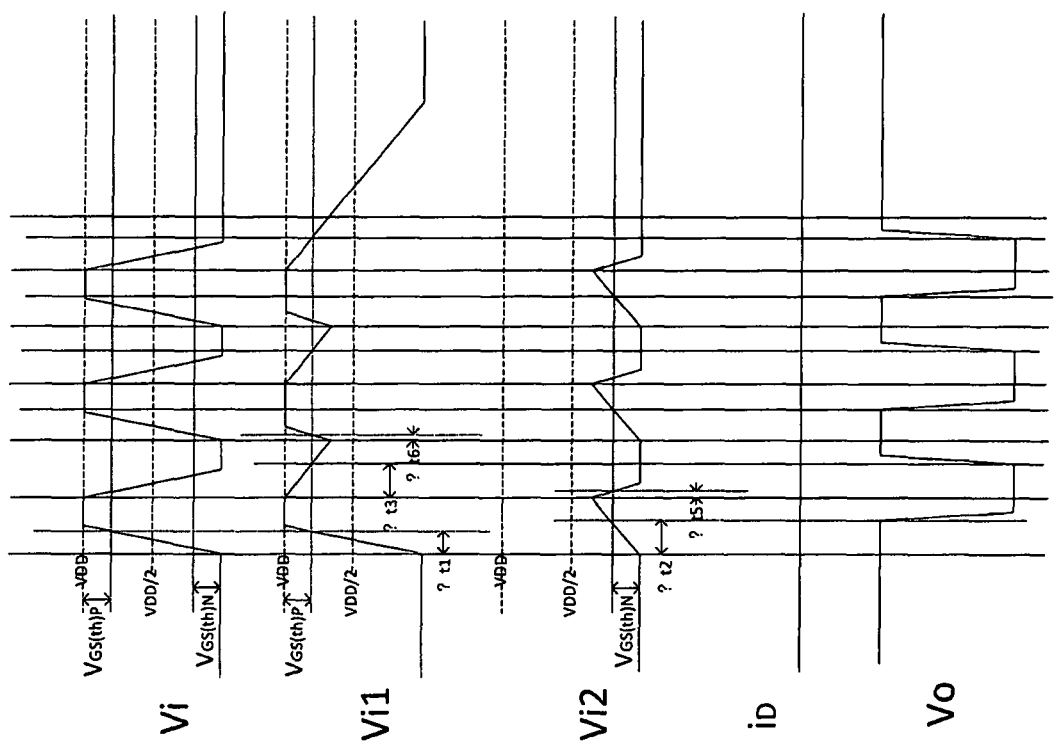

In some embodiments it is not necessary that the input of the first transistor 402 is discharged to the negative supply voltage $V_{SS}$ and that that the input of the second transistor 404 is discharged to the positive supply voltage $V_{DD}$. So this circuit arrangement may be able to work at quite high frequencies. If the frequency of the input signal is increased, the behavior of all nodes of the apparatus may be as depicted in FIG. 5c, assuming that there is no loading at the output 446 of the apparatus. In FIG. 5c some time differences are depicted with notations $\Delta t_1, \Delta t_2, \ldots \Delta t_6$. The time differences should fulfill the following conditions in order to enable a correct operation of the apparatus 100: $\Delta t_6 < \Delta t_1$, $\Delta t_6 < \Delta t_2$, $\Delta t_5 < \Delta t_4$, $\Delta t_5 < \Delta t_3$.

The capacitive loading at the output 446 may have a remarkable impact to the highest frequency the apparatus can tolerate. The higher the capacitive loading at the output 446 the lower the highest frequency.

The diode forward voltage may be as small as possible. For example, schottky diodes or other diodes with small forward voltage may be adopted in the apparatus 100. The resistance values of the resistors R1, R2 and the capacitance values of the capacitors C1, C2 may differ in different embodiments.

Figure 7:
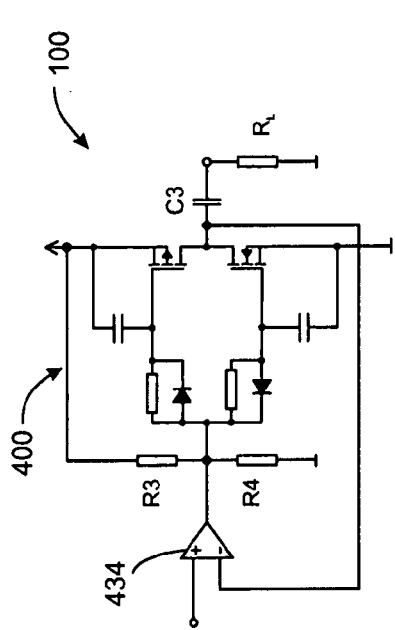
FIG. 7 shows an example of a circuit in which the apparatus is used as an output port.

FIG. 7 shows a simplified block diagram of an apparatus 100 according to another example embodiment. In this non-limiting example embodiment the apparatus 100 is operating as an output amplifier for e.g. audio signals. Signals may be provided to a pre-amplifier 434, which may, for example, be an operational amplifier having a positive (+) and a negative (−) input. In this example configuration the input signal is provided to the positive input, wherein the output signal has the same phase than the input signal. The output of the operational amplifier 434 is connected to the input of the push-pull circuit 400. At the input of the push-pull circuit 400 there may also be biasing components, such as the resistors R3, R4, if needed. The output of the push-pull circuit 400 is connected to a capacitor C3 and also to the negative input of the operational amplifier 434 to provide feedback from the output of the push-pull circuit 400. The load $R_L$ can be connected to the capacitor C3.

Figure 8:
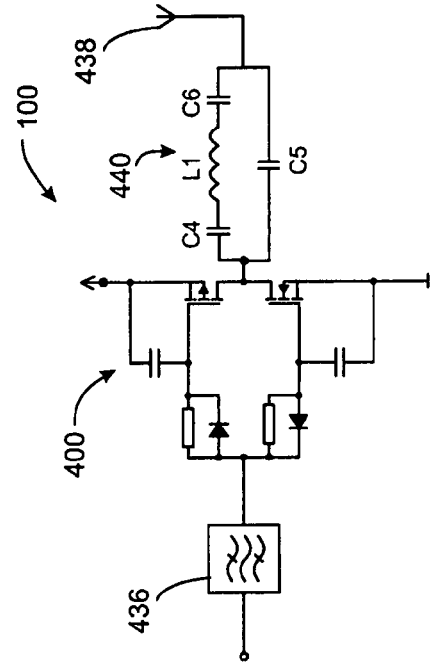
FIG. 8 shows an example of a circuit in which the apparatus is used as a power amplifier coupled to an antenna.

FIG. 8 shows a simplified block diagram of an apparatus 100 according to another example embodiment. In this non-limiting example embodiment the apparatus 100 is operating as a power amplifier of e.g. a transmitter of a wireless communication device. Signals to be transmitted may be band-pass filtered by a band-pass filter 436. The band-pass filtered signals are provided to the input of the push-pull circuit 400 for amplification. The amplified signals at the output of the push-pull circuit 400 may be connected to an antenna 438 e.g. via an impedance matching circuit 440, which may comprise e.g. capacitors C4, C5, C6 and an inductor L1.

Although the above examples describe embodiments of the invention operating within a wireless communication device, it would be appreciated that the invention as described above may be implemented as a part of any apparatus comprising a circuitry in which the push-pull configuration may be implemented. For example, the apparatus 100 may be used in amplifiers such as low-frequency amplifiers, high frequency amplifiers, power amplifiers of transmitters, etc. The apparatus 100 may also be used e.g. in digital integrated circuits for example as output ports or in internal logic circuits or as semiconductor switches etc.

In general, the various embodiments of the invention may be implemented in hardware or special purpose circuits or any combination thereof. While various aspects of the invention may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

In the following some examples will be provided.

According to a first example, there is provided a method comprising:

providing an input signal to an input of a first transistor of a push-pull circuit via a first slew-rate adjuster;

providing the input signal to an input of a second transistor of the push-pull circuit via a second slew-rate adjuster;

effecting by the first slew-rate adjuster and the second slew-rate adjuster the input signal to switch the first transistor on after the second transistor switches off when the amplitude of the input signal increases; and effecting by the first slew-rate adjuster and the second slew-rate adjuster the input signal to switch the second transistor on after the first transistor switches off when the amplitude of the input signal decreases.

In some embodiments the method comprises:
using mosfet transistors as the transistors.

In some embodiments the method comprises:
using a diode and a resistor in parallel to provide a time constant dependent on the direction of change of the input signal to the slew-rate adjusters.

In some embodiments the method comprises using a capacitor to adjust the time constant.

In some embodiments the method comprises using a parasitic capacitance of the transistor to adjust the time constant.

According to a second example there is provided an apparatus comprising:

a push-pull circuit comprising a first transistor and a second transistor; an input to receive an input signal;

a first slew-rate adjuster adapted to provide the input signal to the input of the first transistor;

a second slew-rate adjuster adapted to provide the input signal to the input of the second transistor;

wherein a time constant of the first slew-rate adjuster is dependent on the direction of change of the input signal, and a time constant of the second slew-rate adjuster is dependent on the direction of change of the input signal.

In some embodiments the transistors are mosfet transistors.

In some embodiments the slew-rate adjusters comprise a diode and a resistor in parallel to provide a time constant dependent on the direction of change of the input signal to the slew-rate adjusters.

In some embodiments the slew-rate adjusters comprise a capacitor.

According to a third example, there is provided an apparatus comprising:

means for receiving an input signal;

means for providing the input signal to the input of the first transistor of a push-pull circuit as a low-passed filtered signal;

means for providing the input signal to the input of the second transistor of the push-pull circuit as a low-passed filtered signal;

means for providing the input signal to the input of the first transistor comprising means for arranging a time constant of the slew-rate adjuster dependent on the direction of change of the input signal; and means for providing the input signal to the input of the second transistor comprising means for arranging a time constant of the slew-rate adjuster dependent on the direction of change of the input signal.

In some embodiments of the apparatus the transistors are mosfet transistors.

In some embodiments the means for providing the input signal to the input of the first transistor comprise a first diode and a first resistor in parallel; and the means for providing the input signal to the input of the second transistor comprise a second diode and a second resistor in parallel.

In some embodiments the means for providing the input signal to the input of the first transistor comprise a first capacitor; and the means for providing the input signal to the input of the second transistor comprise a second capacitor.

What is claimed is:

1. A method comprising:
providing an input signal to an input of a first transistor of a push-pull circuit via a first slew-rate adjuster;
providing the input signal to an input of a second transistor of the push-pull circuit via a second slew-rate adjuster;
using a diode and a resistor in parallel to provide a time constant dependent on the direction of change of the input signal to the slew-rate adjusters;
effecting, by the first slew-rate adjuster and the second slew-rate adjuster, the input signal to switch the first transistor on after the second transistor switches off when the amplitude of the input signal increases; and
effecting, by the first slew-rate adjuster and the second slew-rate adjuster, the input signal to switch the second transistor on after the first transistor switches off when the amplitude of the input signal decreases.

2. The method according to claim 1, wherein the first transistor and the second transistor are mosfet transistors.

3. The method according to claim 1, wherein the first transistor and the second transistor are bipolar transistors.

4. The method according to claim 1 comprising using a capacitor to adjust the time constant.

5. The method according to claim 1 comprising using a parasitic capacitance of the first transistor and/or the second transistor to adjust the time constant.

6. An apparatus comprising:
a push-pull circuit comprising a first transistor and a second transistor;
an input to receive an input signal;
a first slew-rate adjuster adapted to provide the input signal to an input of the first transistor, the first slew-rate adjuster comprising a first diode and a first resister in parallel; and
a second slew-rate adjuster adapted to provide the input signal to an input of the second transistor, the second slew-rate adjuster comprising a second diode and a second resister in parallel;
wherein a first time constant of the first slew-rate adjuster is dependent on the direction of change of the input signal, and a second time constant of the second slew-rate adjuster is dependent on the direction of change of the input signal.

7. The apparatus according to claim 6, wherein the first and second transistors are mosfet transistors.

8. The apparatus according to claim 6, wherein the first and second transistors are bipolar transistors.

9. The apparatus according to claim 6, wherein the first diode and the first resister in parallel provide the first time constant dependent on the direction of change of the input signal to the first slew-rate adjuster.

10. The apparatus according to claim 6, wherein the first slew-rate adjuster and/or the second slew-rate adjuster each further comprises a capacitor.

11. The apparatus according to claim 6, wherein the apparatus is a part of a mobile communication device.

12. The apparatus of claim 6, wherein the push-pull amplifier is a part of:
a radio frequency power amplifier;
a digital output port amplifier; or
an audio output amplifier.

13. The apparatus according to claim 6, wherein the second diode and the second resister in parallel provide the second time constant dependent on the direction of change of the input signal to the second slew-rate adjuster.

* * * * *